(12) United States Patent
Wang et al.

(10) Patent No.: US 12,267,963 B2
(45) Date of Patent: Apr. 1, 2025

(54) CIRCUIT BOARD WITH ANTI-CORROSION PROPERTIES AND ELECTRONIC DEVICE HAVING THE SAME

(71) Applicant: CHAMP TECH OPTICAL (FOSHAN) CORPORATION, Foshan (CN)

(72) Inventors: Li-Ping Wang, Foshan (CN);
Yung-Ping Lin, New Taipei (TW);
Yong-Kang Zhang, Shenzhen (CN);
Qiu-Ri Zhang, New Taipei (TW);
You-Zhi Lu, Foshan (CN)

(73) Assignee: CHAMP TECH OPTICAL (FOSHAN) CORPORATION, Foshan (CN)

( * ) Notice: Subject to any disclaimer, the term of this patent is extended or adjusted under 35 U.S.C. 154(b) by 0 days.

(21) Appl. No.: 18/428,187

(22) Filed: Jan. 31, 2024

(65) Prior Publication Data
US 2024/0172370 A1 May 23, 2024

Related U.S. Application Data

(62) Division of application No. 17/740,975, filed on May 10, 2022, now Pat. No. 11,943,875.

(30) Foreign Application Priority Data

Jun. 25, 2021 (CN) .......................... 202110711063.8

(51) Int. Cl.
*H05K 1/02* (2006.01)
*H01L 23/544* (2006.01)
(Continued)

(52) U.S. Cl.
CPC .......... *H05K 3/282* (2013.01); *H05K 3/0091* (2013.01); *H05K 3/103* (2013.01)

(58) Field of Classification Search
CPC ........ H05K 1/02; H05K 1/0218; H05K 1/025; H05K 1/0266; H05K 1/0269; H05K 1/0274; H05K 1/028; H05K 1/0298; H05K 1/115; H05K 1/116; H05K 3/0026; H05K 3/0085; H05K 3/0091; H05K 3/0097; H05K 3/04; H05K 3/091; H05K 3/12; H05K 3/22; H05K 3/28; H05K 3/103; H05K 3/185;
(Continued)

(56) References Cited

U.S. PATENT DOCUMENTS 3,934,335 A * 1/1976 Nelson .................... H05K 3/185
430/311
2008/0230258 A1* 9/2008 Shen ........................ G06F 1/16
174/251

(Continued)

*Primary Examiner* — Xiaoliang Chen
(74) *Attorney, Agent, or Firm* — ScienBiziP, P.C.

(57) ABSTRACT

A circuit board with anti-corrosion properties, a method for manufacturing the circuit board, and an electronic device are provided. The circuit board includes a circuit substrate, a first protective layer, and a second protective layer. The circuit substrate includes a base layer and an outer wiring layer formed on the base layer. The circuit substrate further defines a via hole connected to the outer wiring layer. The first protective layer is formed on the outer wiring layer and an inner sidewall of the via hole, and is made of a white oil. The second protective layer is formed on the first protective layer.

3 Claims, 4 Drawing Sheets

(51) Int. Cl.
*H01L 33/10* (2010.01)
*H01L 33/38* (2010.01)
*H01L 33/54* (2010.01)
*H01L 33/56* (2010.01)
*H01L 33/58* (2010.01)
*H01L 33/60* (2010.01)
*H01L 33/62* (2010.01)
*H05K 3/00* (2006.01)
*H05K 3/10* (2006.01)
*H05K 3/12* (2006.01)
*H05K 3/22* (2006.01)
*H05K 3/28* (2006.01)

(58) Field of Classification Search
CPC ...... H05K 3/282; H05K 3/445; H05K 3/1241; H05K 3/1275; H05K 3/4608; H05K 3/4644; H05K 5/0017; H01L 23/544; H01L 25/0753; H01L 27/124; H01L 27/127; H01L 27/156; H01L 33/0005; H01L 33/10; H01L 33/38; H01L 33/54; H01L 33/56; H01L 33/58; H01L 33/60; H01L 33/62; G02F 1/1336; G02F 1/133603; G02F 1/133605; G02F 1/133606; G02F 1/133612; G09G 3/3426
USPC ................ 174/257, 251, 266; 361/779, 795; 362/84, 97.1, 297; 430/311, 313, 315
See application file for complete search history.

(56) References Cited

U.S. PATENT DOCUMENTS

| | | | |
|---|---|---|---|
| 2011/0062134 A1* | 3/2011 | Lochtman | D06M 15/233 428/221 |
| 2012/0164474 A1* | 6/2012 | Hueffer | C10M 105/74 427/156 |
| 2015/0016087 A1* | 1/2015 | Feng | F21K 9/68 29/847 |
| 2015/0378232 A1 | 12/2015 | Snow et al. | |
| 2017/0142843 A1* | 5/2017 | Zhang | H05K 3/0091 |
| 2019/0327825 A1* | 10/2019 | Zha | G02F 1/133605 |
| 2019/0355294 A1* | 11/2019 | Gu | G09G 3/32 |
| 2019/0357359 A1* | 11/2019 | Zhang | H05K 3/0085 |
| 2020/0074917 A1* | 3/2020 | Li | G09G 3/3426 |
| 2020/0188954 A1 | 6/2020 | Zong | |
| 2020/0409215 A1* | 12/2020 | Chen | H01L 33/60 |
| 2021/0305221 A1* | 9/2021 | Wang | H05K 1/0269 |
| 2021/0398954 A1* | 12/2021 | Gu | H01L 23/544 |
| 2022/0260876 A1* | 8/2022 | Zhao | H01L 27/156 |
| 2022/0310660 A1* | 9/2022 | Cao | G02F 1/133603 |
| 2022/0320368 A1* | 10/2022 | Hu | H01L 33/10 |
| 2023/0139020 A1* | 5/2023 | Xiao | H01L 25/0753 362/97.1 |
| 2023/0155092 A1* | 5/2023 | Qin | H01L 33/62 257/79 |

* cited by examiner

… (1)

CIRCUIT BOARD WITH ANTI-CORROSION PROPERTIES AND ELECTRONIC DEVICE HAVING THE SAME

FIELD

The subject matter herein generally relates to circuit boards, and more particularly, to a circuit board with anti-corrosion properties and an electronic device having the circuit board.

BACKGROUND

In order to meet the requirements of high density and multi-function of printed circuit board (PCB), the PCB usually has a plurality of wiring layers and via holes electrically connected the wring layers together. However, corrosion may occur in the via holes and on an outer wiring layer of the PCB during use, which reduces the reliability of the PCB.

Therefore, there is a room for improvement in the art.

BRIEF DESCRIPTION OF THE DRAWINGS

Implementations of the present technology will now be described, by way of embodiment, with reference to the attached figures.

DETAILED DESCRIPTION

Figure 1:
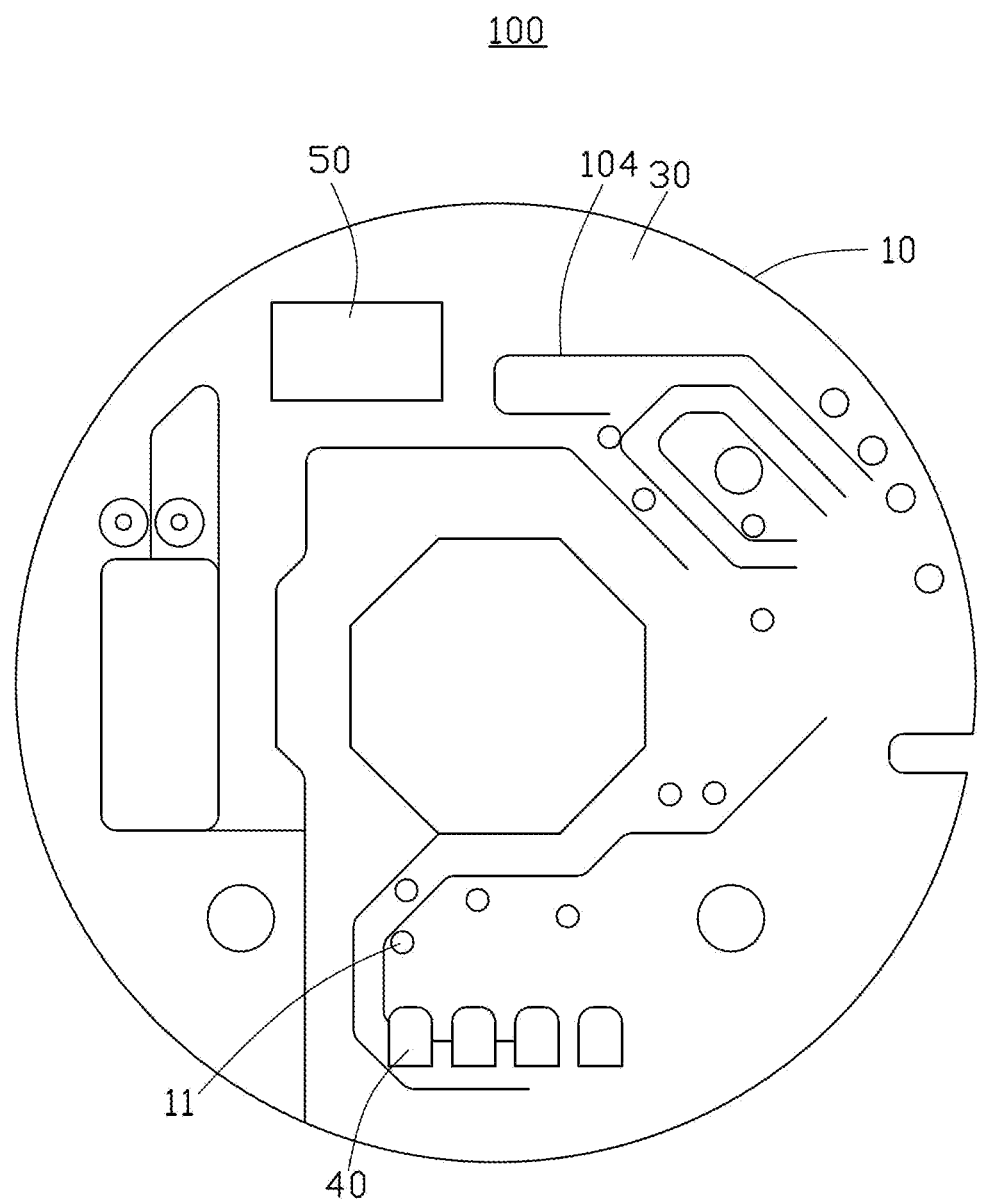
FIG. 1 is a top view of a circuit board according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and members have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 2:
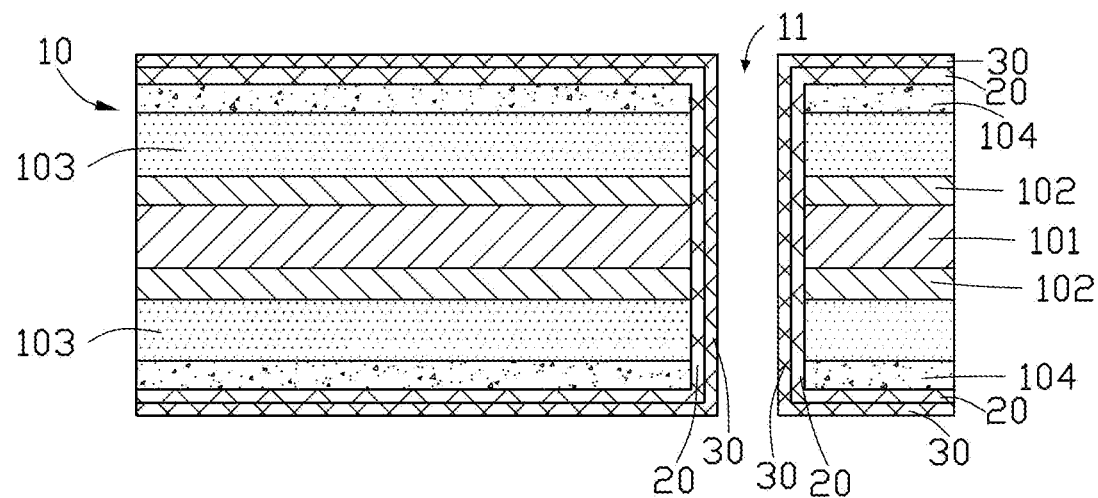
FIG. 2 is a cross-sectional view of the circuit board of FIG. 1.

Referring to FIGS. 1 and 2, a circuit board 100 is provided according to an embodiment of the present disclosure. The circuit board 100 includes a circuit substrate 10, at least one first protective layer 20 formed on the circuit substrate 10, and a second protective layer 30 formed on each first protective layer 20.

In one embodiment, the circuit substrate 10 includes a base layer 101, two inner wiring layers 102, two insulating layers 103, and two outer wiring layers 104. The two inner wiring layers 102 are formed on two opposite surfaces of the base layer 101. The two insulating layers 103 are formed on the two inner wiring layers 102. The two outer wiring layers 104 are formed on the two insulating layers 103. That is, in this embodiment, the circuit board 100 totally has four wiring layers. Furthermore, in this embodiment, two first protective layer 20 and two second protective layers 30 are included in the circuit board 100. The two first protective layer 20 are formed on the outer wiring layers 104. The two second protective layers 30 are formed on the two first protective layers 20.

The circuit substrate 10 defines a via hole 11 penetrating the outer wiring layers 104, the insulating layers 103, the inner wiring layers 102, and the base layer 101. The outer wiring layers 104 and the inner wiring layers 102 are electrically connected to each other through the via hole 11. In detail, the via hole 11 includes a through hole and a conductive layer formed on the inner sidewall of the through hole. The through hole penetrates the outer wiring layers 104, the insulating layers 103, the inner wiring layers 102, and the base layer 101. The conductive layer electrically connecting the outer wiring layers 104 to the inner wiring layers 102.

The number of the wiring layers of the circuit substrate 10 can be varied. In another embodiment, the circuit substrate 10 may only include two wiring layers, for example, an inner wiring layers 102 formed on the base layer 101, and an outer wiring layer 104 formed on the inner wiring layers 102. In other embodiments, the circuit substrate 10 may only include two wiring layers, for example, two outer wiring layers 104 formed on two opposite surfaces of the base layer 101.

Each first protective layer 20 is further formed on an inner sidewall of the via hole 11. Each second protective layer 30 is formed on the first protective layer 20 (the second protective layer 30 also formed on the inner sidewall of the via hole 11 having the first protective layer 20). The first protective layer 20 is made of a white oil. The white oil is a particularly preferred refined grade of mineral oil. The white oil substantially includes only hydrogen and carbon molecules that are formed by passing hydrocarbons through a hydrogenation unit to remove aromatic groups and other possibly deleterious substances. The white oil has a good anti-corrosion performance. Thus, probability of corrosion happened to the via hole 11 and the outer wiring layers 104 is reduced.

In one embodiment, the first protective layer 20 is formed by silk-screen printing, which improves the uniformity of the first protective layer 20 and also reduces the stress in the first protective layer 20. The silk-screen printing is usually used to print a mark 50 (for example, a certification mark) on the circuit substrate 10. In this embodiment, the silk-screen printing is also used to form the first protective layer 20 when printing the mark 50, so as to avoid an increase of additional steps during the manufacturing. That is, the mark 50 and the first protective layer 20 are formed by a same printing process.

The second protective layer 30, which is formed on the first protective layer 20, further reduce the probability of corrosion happened the via hole 11 and the outer wiring layers 104. The second protective layer 30 is made of a three proofing paint. The three proofing paint may be an acrylic three proofing paint, a polyurethane three proofing paint, or a silicone three proofing paint. In this embodiment, the second protective layer 30 is also formed by the silk-screen process. In another embodiment, the second protective layer 30 may be formed by coating.

Referring to FIG. 1, the circuit board further includes at least one electronic component 40 are formed on the circuit substrate 10. Each electronic component 40 can be mounted on and electrically connected to at least one of the outer wiring layers 104.

Figure 3:
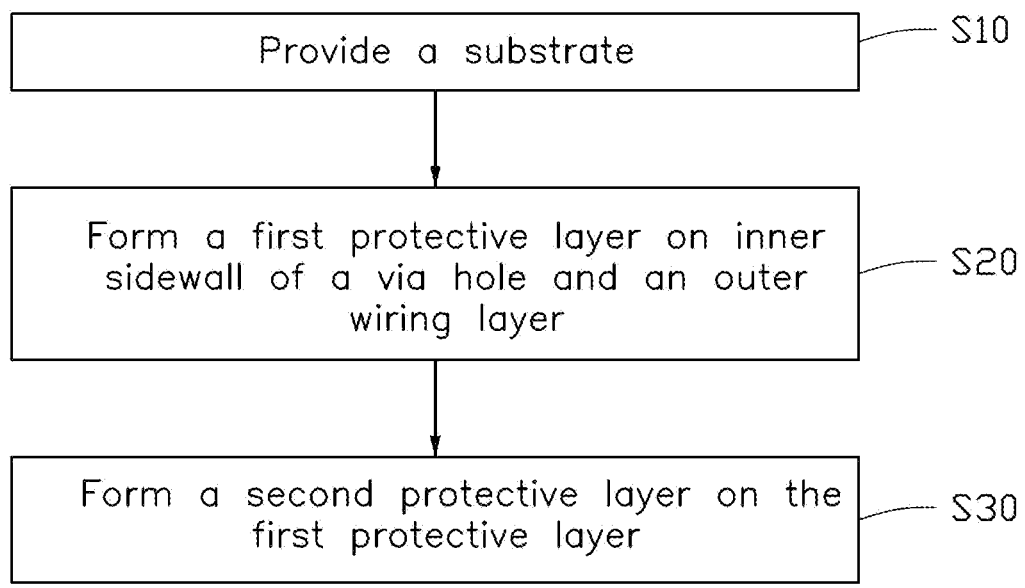
FIG. 3 is a flowchart of a method for manufacturing a circuit board according to an embodiment of the present disclosure.

Referring to FIG. 3, a method for manufacturing a circuit board 100 is provided by way of example, as there are a variety of ways to carry out the method. Each block shown in the figure represents one or more processes, methods, or subroutines, carried out in the example method. Furthermore, the illustrated order of blocks is illustrative only and the order of the blocks can change. Additional blocks can be added or fewer blocks may be utilized or the order of the blocks may be changed, without departing from this disclosure. The method can begin at block S10.

In block S10, a circuit substrate 10 is provided. The circuit substrate 10 includes a base layer 101, an inner wiring layer 102, an insulating layer 103, and an outer wiring layer 104. The inner wiring layer 102, the insulating layer 103, and the outer wiring layer 104 are successively formed on the base layer 101. The circuit substrate 10 further defines via hole 11 penetrating the circuit substrate 10. The outer wiring layer 104 and the inner wiring layer 102 are electrically connected to each other through the via hole 11.

In block S20, a silk-screen printing is performed on an inner sidewall of the via hole 11 and on the outer wiring layer 104 to form a first protective layer 20. The first protective layer 20 is made of a white oil.

Before forming the first protective layer 20, a plurality of electronic components 40 can be installed on the outer wiring layer 104.

In block S30, a second protective layer 30 is formed on the first protective layer 20 to obtain the circuit board 100. The second protective layer 30 further reduces the probability of corrosion happened to the via hole 11 and the outer wiring layer 104. The second protective layer 30 is made of a three proofing paint.

In this embodiment, the second protective layer 30 is also formed by the silk-screen printing. In another embodiment, the second protective layer 30 may be formed by coating.

Figure 4:
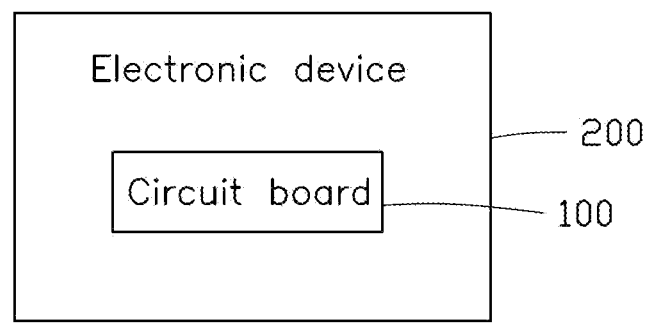
FIG. 4 is a block diagram of an electronic device according to an embodiment of the present disclosure.

Referring to FIG. 4, an electronic device 200 is also provided according to an embodiment of the present disclosure. The electronic device 200 includes the above-mentioned circuit board 100. The electronic device 200 may be a tablet computer, a server, a smart phone, and so on.

Example

A circuit substrate was provided, including a base layer, an inner wiring layer, an insulating layer, and an outer wiring layer. A via hole was defined in the circuit board, which electrically connecting the inner wiring layer to the outer wiring layer. A first protective layer was formed on an inner sidewall of the via hole and on the outer wiring layer by silk-screen printing. The first protective layer was made of a white oil. Then, a second protective layer was formed on the first protective layer by silk-screen printing to obtain the circuit board. The second protective layer was made of a three proofing paint.

Comparative Example

Different from the above example, the first protective layer in the Comparative example was omitted.

A neutral salt spray (NSS) test was performed on the circuit boards formed by the Example and the Comparative example. Results show that the circuit board formed by the Example generates no corrosion after more than 3 h in the test, while the circuit board obtained in the Comparative example cannot withstand the test for 0.5 h. Thus, the first protective layer made of white oil can better reduce the probability of corrosion happened to the via hole and the outer wiring layer.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A circuit board comprising:
    a circuit substrate comprising a base layer and an outer wiring layer formed on the base layer, and a via hole connected to the outer wiring layer;
    a first protective layer made of white oil and formed on the outer wiring layer and an inner sidewall of the via hole;
    a mark made of white oil and formed on the outer wiring layer by a silk-screen printing process, the silk-screen printing process further configured to form the first protective layer when printing the mark; and
    a second protective layer made of a three proofing paint, the second protective layer formed on the first protective layer which is on the outer wiring layer, the second protective layer further formed on the first protective layer which is on the inner sidewall of the via hole.

2. The circuit board according to claim 1, further comprising an electronic component mounted on the outer wiring layer.

3. The circuit board according to claim 1, wherein the circuit substrate further comprises an inner wiring layer sandwiched between the base layer and the outer wiring layer, the outer wiring layer and the inner wiring layer are electrically connected to each other through the via hole.

* * * * *